(12) United States Patent
Weber

(10) Patent No.: US 7,972,954 B2
(45) Date of Patent: Jul. 5, 2011

(54) POROUS SILICON DIELECTRIC

(75) Inventor: Frank Weber, Austin, TX (US)

(73) Assignee: Infineon Technologies AG, Munich (DE)

( * ) Notice: Subject to any disclaimer, the term of this patent is extended or adjusted under 35 U.S.C. 154(b) by 1353 days.

(21) Appl. No.: 11/338,059

(22) Filed: Jan. 24, 2006

(65) Prior Publication Data
US 2007/0173073 A1   Jul. 26, 2007

(51) Int. Cl.
*H01L 21/4763* (2006.01)

(52) U.S. Cl. ........ 438/618; 438/637; 438/700; 438/769; 438/778; 438/958; 257/774; 257/E23.141; 257/E23.145; 257/E23.175; 257/E21.575

(58) Field of Classification Search ............... 438/637, 438/700, 761, 769, 778, 958, 960, FOR. 118, 438/FOR. 355; 257/774, E23.141, E23.145, 257/E23.175, E21.575
See application file for complete search history.

(56) References Cited

U.S. PATENT DOCUMENTS

| | | | |
|---|---|---|---|
| 3,962,052 A | 6/1976 | Abbas et al. | |
| 5,266,530 A | 11/1993 | Bagley et al. | |
| 5,332,697 A | 7/1994 | Smith et al. | |
| 5,635,419 A | 6/1997 | Geiss et al. | |
| 6,287,936 B1 | 9/2001 | Perea et al. | |
| 6,759,500 B1 * | 7/2004 | Dolle et al. | 526/351 |
| 6,814,849 B2 | 11/2004 | Lockwood et al. | |
| 6,870,263 B1 | 3/2005 | Clevenger et al. | |
| 6,914,320 B2 | 7/2005 | Chen et al. | |
| 6,939,797 B2 | 9/2005 | Barth et al. | |
| 7,259,100 B2 * | 8/2007 | Zurcher et al. | 438/700 |
| 7,259,101 B2 * | 8/2007 | Zurcher et al. | 438/700 |
| 2002/0022339 A1 * | 2/2002 | Kirchhoff | 438/409 |
| 2002/0074314 A1 * | 6/2002 | Bohn et al. | 216/56 |
| 2002/0137350 A1 * | 9/2002 | Endoh et al. | 438/700 |
| 2002/0139975 A1 | 10/2002 | Lewis et al. | |
| 2003/0198895 A1 | 10/2003 | Toma et al. | |
| 2004/0116480 A1 * | 6/2004 | Nakagawa et al. | 514/357 |
| 2005/0085001 A1 * | 4/2005 | Lockwood et al. | 438/57 |
| 2005/0186788 A1 | 8/2005 | Lu et al. | |
| 2005/0199906 A1 * | 9/2005 | Chan et al. | 257/192 |
| 2006/0247303 A1 * | 11/2006 | Bischoff et al. | 514/450 |
| 2009/0209765 A1 * | 8/2009 | Sakai et al. | 546/139 |

* cited by examiner

*Primary Examiner* — N Drew Richards
*Assistant Examiner* — Joannie A Garcia
(74) *Attorney, Agent, or Firm* — Slater & Matsil, L.L.P.

(57) ABSTRACT

Embodiments of the invention provide a semiconductor device having dielectric material and its method of manufacture. A manufacturing method comprises forming a layer of silicon over a substrate, forming an opening through the layer of silicon, filling the opening with a conductor; and anodically etching the layer of silicon so as to form porous silicon. Embodiments may further include passivating the porous silicon such as by treating its surface with an organometallic compound. Other embodiments of the invention provide a semiconductor device comprising a layer comprising functional devices; and an interconnect structure over the layer, wherein the interconnect structure comprises a porous silicon dielectric. In an embodiment of the invention, the interconnect structure comprises a dual damascene interconnect structure. Other embodiments may include a passivation step after the step of oxidizing the porous silicon.

20 Claims, 2 Drawing Sheets

POROUS SILICON DIELECTRIC

TECHNICAL FIELD

This invention relates generally to semiconductor device manufacturing and more particularly to the formation and processing of low-k dielectric films.

BACKGROUND

As the density of semiconductor devices increases and the size of circuit elements becomes smaller, the resistance capacitance (RC) delay time increasingly dominates the circuit performance. To reduce the RC delay, the demands on interconnect layers for connecting the semiconductor devices to each other increases. Therefore, there is a desire to switch from traditional silicon dioxide based dielectrics to low-k dielectrics. These materials are particularly useful as intermetal dielectrics, IMDs, and as interlayer dielectrics, ILDs.

One example of a low-k material is fluorine-doped silicon dioxide, or fluorosilicate glass (FSG). Another widely used material is a carbon-doped oxide or organosilicate glass (OSG). OSG films typically comprise $Si_wC_xO_yH_z$ wherein the tetravalent silicon may have a variety of organic group substitutions. A commonly used substitution creates methyl silsesquioxane (MSQ), wherein a methyl group creates a $SiCH_3$ bond in place of a SiO bond. There are several approaches known in the art for reducing the k-value of dielectric films. These include decreasing the film density, reducing the film ionization, and reducing the film polarization.

Since air has a dielectric constant of about 1, one method for making low-k dielectrics incorporates air into dense materials to make them porous. The dielectric constant of the resulting porous material is combination of the dielectric constant of air and the dielectric constant of the dense material. Therefore, it is possible to lower the dielectric constant of current low-k materials by making them porous. Silica based xerogels and aerogels, for example, incorporate a large amount of air in pores or voids, thereby achieving dielectric constants less than 1.95 with pores are as small as 5-10 nm.

A major drawback with porous dielectrics, however, is that they are susceptible to damage from plasma etching and ashing processes used in device fabrication. Porous dielectrics are also softer than conventional dielectrics so they are more easily damaged during aggressive handling operations like chemical mechanical polishing. Damaged dielectrics often have surface fractures that allow processing chemicals or moisture to enter the internal porous network, thereby causing corrosion, mechanical damage, or an increase in the dielectric constant. Such damage may decrease reliability without any direct methods of detection. Pore damage may also cause a surface that is preferably hydrophobic to become hydrophilic, which may alter the wetability of various solvents.

In light of problems such as these, there remains a need for low-k dielectrics that not only have a porous structure, but that also have the chemical and mechanical stability to withstand the harsh manufacturing steps.

SUMMARY OF THE INVENTION

These and other problems are generally solved or circumvented, and technical advantages are generally achieved, by preferred embodiments of the present invention that provide a dielectric material, a semiconductor device, and a method of manufacture.

Embodiments of the invention provide a semiconductor device having dielectric material and its method of manufacture. A method comprises forming a layer of silicon over a substrate, forming an opening through the layer of silicon, filling the opening with a conductor; and anodically etching the layer of silicon so as to form porous silicon. Embodiments may further include passivating the porous silicon such as by treating its surface with an organometallic compound. Other embodiments may include oxidizing the porous silicon, which might be followed by a passivation.

Other embodiments of the invention provide a semiconductor device and its method of manufacture. A method comprises forming a layer comprising functional devices, and forming an interconnect structure over the layer, wherein the interconnect structure comprises a porous silicon dielectric. In an embodiment of the invention, the interconnect structure comprises a dual damascene interconnect structure The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making, operation, and fabrication of the presently preferred embodiments are discussed in detail below. However, the embodiments and examples described herein are not the only applications or uses contemplated for the invention. The specific embodiments discussed are merely illustrative of specific ways to make and use the invention, and do not limit the scope of the invention or the appended claims.

Exemplary materials, structures, and methods are provided below for fabricating a semiconductor device that has damascene interconnect structure. Although the exemplary embodiments are described as a series of steps, it will be appreciated that this is for illustration and not for the purpose of limitation. For example, some steps may occur in a different order than illustrated yet remain within the scope of the invention. Also, not all illustrated steps are necessarily required to implement the invention. Furthermore, the materials, structures, and methods according to embodiments of the invention may be implemented in areas other than semiconductor manufacturing.

The present invention will now be described with respect to preferred embodiments in a specific context, namely, specific steps in the manufacture of an integrated circuit comprising multiple level copper metallization formed by way of a conventional damascene process. It is believed that embodiments of this invention are advantageous when used in a damascene metallization process. It is further believed that embodiments described herein will benefit other manufacturing applications involving low-k films or dielectrics not specifically illustrated.

Figure 1:
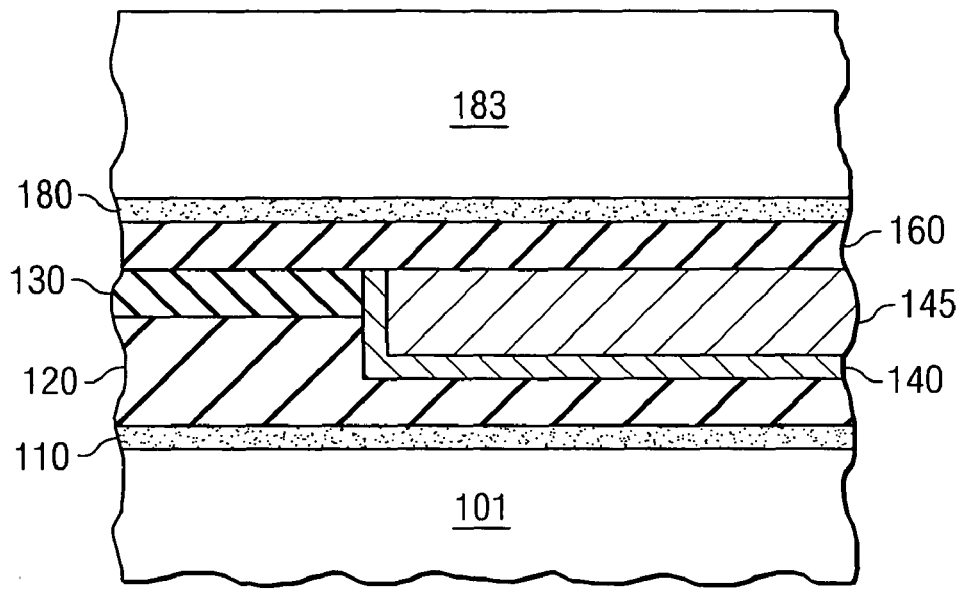
FIGS. 1 and 2 are cross-sectional views illustrating the manufacture of an exemplary damascene structure according to embodiments of the invention.

Referring now to FIG. 1, a preferred embodiment of the interconnect structure of the invention comprises a substrate 101 which may contain functional devices such as transistors. A dielectric layer 120, commonly known as an inter-level dielectric (ILD), overlies the substrate 101. An adhesion promoter layer 110 may be disposed between the substrate 101 and ILD layer 120. A hardmask layer 130 is preferably disposed on ILD layer 120. At least one conductor 145 is embedded in ILD layer 120 and hardmask layer 130. A diffusion barrier liner 140 may be disposed between ILD layer 120 and conductor 145. The top surface of conductor 145 is made coplanar with the top surface of the hardmask layer 130, usually by a chemical-mechanical polish (CMP) step. A cap layer 160 is disposed on conductor 145 and hardmask layer 130, is disposed on cap layer 160. An adhesion promoter 180 is formed over the cap layer.

The ILD layer 120 may be formed of any suitable dielectric material, although low-k dielectric materials are preferred. As used herein, low-k refers to dielectrics having a dielectric constant less than silicon oxide, which is about 3.9. Suitable dielectric materials include carbon-doped silicon dioxide materials; fluorinated silicate glass (FSG); organic polymeric thermoset materials, silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied: Materials). Examples of carbon-doped silicon dioxide materials, or organosilanes, include Black Diamond™ (available from Applied Materials) and Coral™ (available from Novellus). An example of an HSQ material is FOX™ (available from Dow Corning). For this embodiment, preferred dielectric materials are organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell). ILD layer 120 may be about 100 nm to about 1000 nm thick, but these layers are each preferably about 600 nm thick. The dielectric constant for ILD layer 120 is preferably about 1.8 to about 3.5, and most preferably about 2.0 to about 2.9.

Alternatively, ILD layer 120 may be formed of a porous dielectric material, such as MesoELK™ (available from Air Products) and XLK™ (a porous version of FOx, available from Dow Corning). For example, if the ILD layer 120 is formed of such porous dielectric material, the dielectric constant of these layers is preferably less than about 2.6, and is most preferably about 1.5 to 2.5. It is particularly preferred to use an organic polymeric thermoset material having a dielectric constant of about 1.8 to 2.2. The ILD layer 120 may also be formed according to the process described below with respect to cap layer 160.

The adhesion promoter layers 110 and 180 are preferably about 9 nm thick, and may be composed of any material suitable for enhancing adhesion of the dielectric material in ILD layers 120 and 119 to the underlying surfaces. For example, if SiLK™ is used for ILD layer 120, adhesion promoter layers 110 and 180 may be formed of an adhesion promoter known as AP4000 (also available from The Dow Chemical Company).

Hardmask layer 130 may be formed of any suitable dielectric material. In one preferred embodiment, hardmask layer 130 are formed of silicon nitride, and preferably have a composition of about 30 to 45 atomic percent silicon, about 30 to 55 atomic percent nitrogen, and about 10 to 25 atomic percent hydrogen. Most preferably, these silicon nitride hardmask layers have a composition of about 41 atomic percent silicon, about 41 atomic percent nitrogen, and about 17.5 atomic percent hydrogen. Alternatively, in another preferred embodiment, hardmask layer 130 are formed of silicon carbide, and preferably have a composition of about 20 to 40 atomic percent silicon, about 20 to 50 atomic percent carbon and about 20 to 45 atomic percent hydrogen. A particularly preferred composition is about 27 atomic percent silicon, about 36 atomic percent carbon and about 37 atomic percent hydrogen.

The conductor 145 may be formed of any suitable conductive material, such as copper or aluminum. Copper is particularly preferred as the conductive material, due to its relatively low resistance. Copper conductors 145 may contain small concentrations of other elements. Diffusion barrier liner 140 may comprise one or more of the following materials: ruthenium, tantalum, titanium, tungsten and the nitrides of these metals.

The cap layer 160 may be formed of silicon nitride, silicon carbide, boron nitride or other suitable dielectric material, and is preferably formed using a HDP CVD process. It has been discovered that materials deposited using a HDP CVD process provide superior adhesion and superior electromigration resistance. However, materials exhibiting similar properties but deposited by other processes may also be used for cap layer 160. Cap layer 160 is most preferably formed of HDP CVD silicon nitride having a composition of about 30 to 50 atomic percent silicon, about 40 to 65 atomic percent nitrogen and about 5 to 13 atomic percent hydrogen. A particularly preferred composition for cap layers 160 and 123 is about 40 atomic percent silicon, about 52 atomic percent nitrogen, and about 8 atomic percent hydrogen. Cap layer 160 preferably has a thickness in the range of about 25 to 700 angstroms, and most preferably in the range of about 50 to 350 angstroms. Diffusion barrier layer 140 and cap layer 160 may also comprise other materials known for preventing metal diffusion.

The silicon layer 183 is preferably deposited at a temperature low enough to avoid degrading underlying layers or devices embedded in the substrate 101. Therefore, the deposition temperature may be below about 400° C. and preferably below about 250° C. and more preferably below about 23° C. The silicon layer 183 may comprise a polycrystalline layer, although a single crystal layer is more preferred.

Continuing with FIG. 1, preferred embodiments of the invention include forming a silicon layer 183 over the substrate 101 and more preferably over the conductor 145. The silicon layer 183 may be deposited using conventional silicon epitaxy methods including PVD, CVD, PECVD, MBE, and ALD. As described below in connection with preferred embodiments of the invention, the silicon layer 183 is converted to a porous dielectric layer after forming a damascene interconnect structure through the silicon layer 183.

Figure 2:
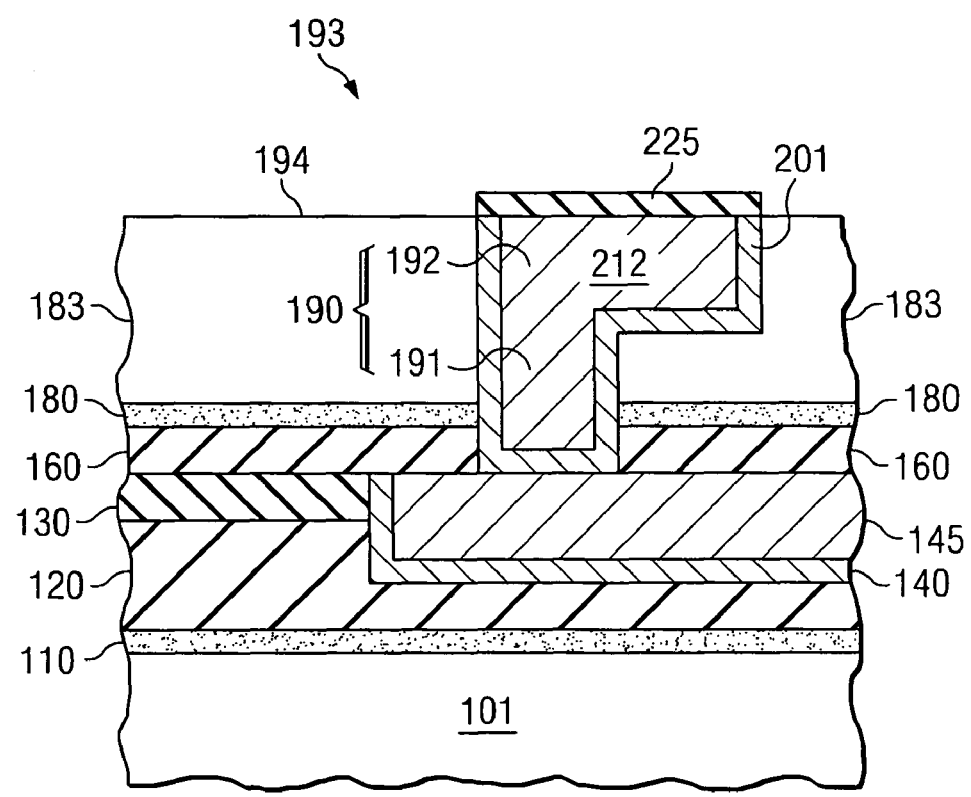

Turning now to FIG. 2, there is illustrated the intermediate structure of FIG. 1 after further processing according to embodiments of the invention. Using conventional lithography and patterning techniques, a damascene interconnect opening 190, which is comprised of a via 191 and a trench 192, is formed through the silicon layer 183, the cap layer, and the adhesion promoter 180 to the conductor 145. The damascene interconnect opening 190 is lined with a diffusion barrier liner 201, which may be formed using the same materials and methods described above with respect to the diffusion barrier 140. Next, the damascene interconnect opening 190 is filled with a conductor 212, which may be formed using the same materials and methods as described above with respect to conductor 145. Next the intermediate structure is planarized, such as with CMP.

Next a second dielectric cap 225 is selectively formed on the conductor 212 thereby producing the intermediate structure 193 illustrated in FIG. 2. The second dielectric cap 225 preferably comprises porous silicon or derivatives thereof. As shown in FIG. 2, the conductor is preferably enclosed by 201 and 225 to protect it in later process steps and in the end product. As shown in FIG. 2, the surface 194 of the silicon layer 183 is exposed in the intermediate structure 193. Next, the silicon layer 183 is anodically oxidized.

Figure 3:
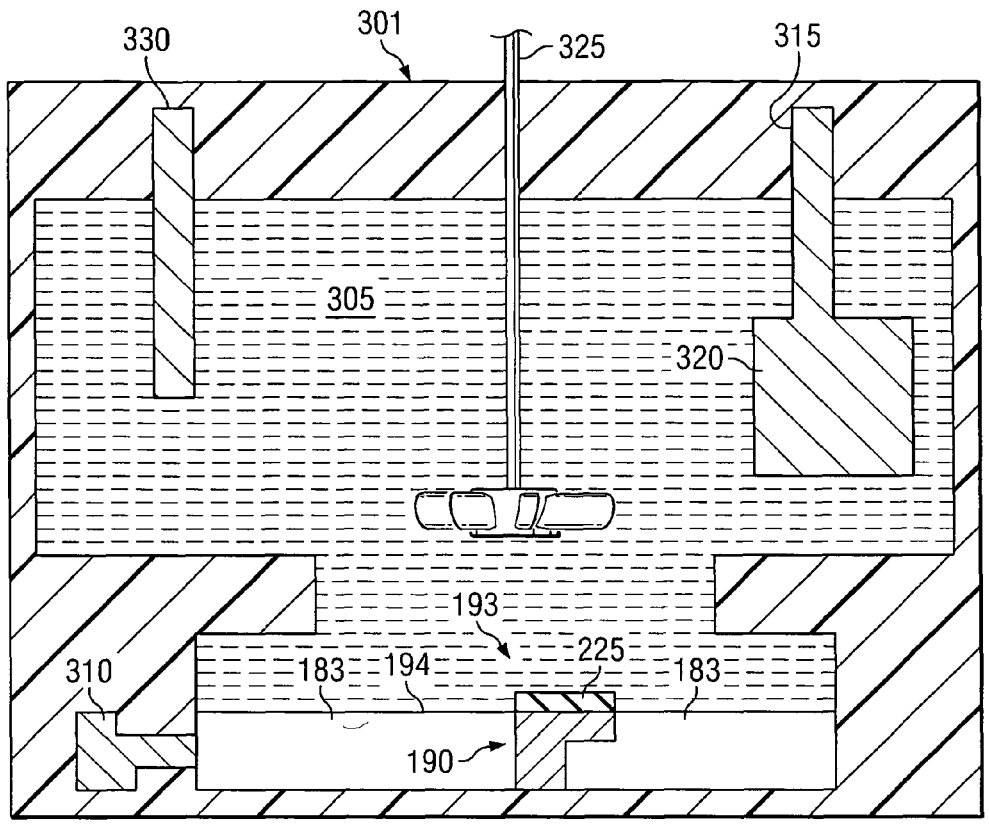
FIG. 3 is schematic diagram of an apparatus for anodically oxidizing silicon.

A suitable electrochemical apparatus 301 for anodically oxidizing the intermediate structure 193 is illustrated in FIG. 3. The apparatus 301 comprises an electrolyte 305 that contacts the surface 194 of the silicon layer 183. An anode 310 is in electrical contact with the silicon layer 183. A cathode 315 may comprise a platinum grid 320 that is immersed in the electrolyte 305. The apparatus 301 may also include a mechanical stirrer 325 and a reference electrode 330 that is also immersed in the electrolyte 305.

The electrolyte 305 preferably comprises an acid electrolyte, which may comprise hydrofluoric acid and at least one other acid. In an embodiment, the electrolyte comprises an aqueous solution of hydrofluoric acid and acetic acid. The hydrofluoric acid concentration is 40% by weight, while that of the acetic acid is 5% by weight. The pH of such an electrolyte is then below 2. Anodic oxidation is effected by applying a voltage between the anode 310 and the cathode 315 so as to make a constant anodic current flow, corresponding to an anodic current density equal to about 3 mA/cm$^2$. The rate of conversion of the silicon into porous silicon is then on the order of 0.2 microns/minute and the final porosity obtained is on the order of 60%. Although acetic acid serves as a very good surfactant, to facilitate the removal of the hydrogen bubbles further, gentle mechanical agitation may optionally be carried out using the stirrer 325.

The anodic oxidation is preferably continued until pores are formed completely through the thickness of the silicon layer 183. At this point, the resistance increases and, since the operation has been carried out at constant current, this leads to an increase in the voltage between the anode 310 and the reference electrode 330. The anodic oxidation is then stopped by cutting off the current. Therefore, anodically etching a layer of silicon may include measuring a potential difference between a pair of electrodes arranged in the electrolyte, and stopping the anodic oxidation when an increase in the potential difference is detected.

Figure 4:
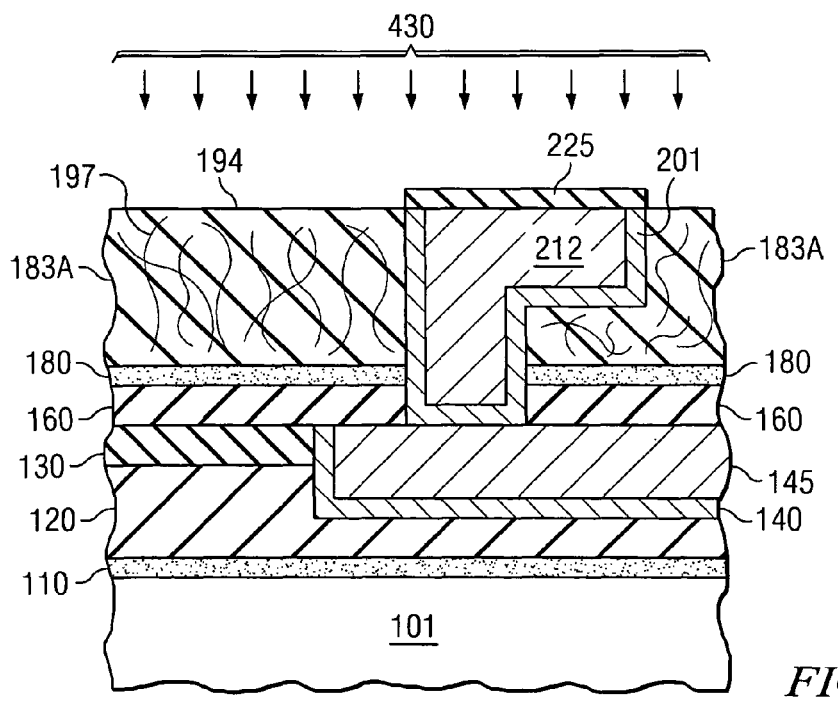
FIG. 4 is a cross-sectional of a silicon porous dielectric according to preferred embodiments of the invention.

Turning now to FIG. 4, the result of the anodic oxidation is to form a porous silicon layer 183A having a plurality of interconnecting pores 197. Preferably, the porous silicon layer 183A has a porous structure and properties substantially similar to dielectric 120 as described above. Most preferably, the dielectric constant is of the porous silicon layer 183A is typical of a low-k dielectric, i.e. less than about 3.9.

Generally, the freshly formed porous silicon will undergo additional oxidation and/or hydration upon exposure to air. Since this may increase the dielectric constant, embodiments of the invention may further include a passivation process 430 that stabilizes the surface 194 of the porous dielectric 183A.

In an additional optional step the porous silicon may be oxidized to a porous silica by a RTP (rapid temperature processing) $H_2O$ and/or an $O_2$ process. The much slower furnace process, however, leads to a higher thermal budget and could cause migration effects of the conductor or other ions. Embodiments of the invention may therefore include a porous silicon dielectric, a porous silica dielectric, and combinations thereof.

In preferred embodiments, passivation may comprise a two-step chemical process that converts surface silanol groups to a carbon-containing, organic group. The first step includes using a halogenating reagent, or agent, to convert the silanol group to a silicon halide. In case of an unoxidized silicon surface the halide may be formed directly without the silanol group as intermediate. The second step includes using a derivatization reagent to replace the halide with a suitable organic group. In a preferred embodiment, the halogenating agent includes thionyl chloride and the derivatization agent includes an organometallic compound, preferably methyllithium. In another embodiment, the halogenating agent is selected from the group consisting essentially of $SO_2Cl_2$ (sulfuryl chloride) or $COCl_2$ (carboxydichloride). In another embodiment, the organometallic compound comprises a Grignard reagent. In yet another embodiment, the organometallic compound comprises an organic lithium compound, RLi, wherein R is selected from a group consisting essentially of alkyl or aryl compounds. In other embodiment, the organometallic compound is trimethyl aluminum, or more generally $R_A R_B R_C Al$, wherein $R_{A-C}$ may independently include an alkyl or aryl group. Other embodiments may include non-organometallic derivatizing compounds generally represented by $R_A R_B R_C C(R_D X)$ or $R_A R_B R_C Si(R_D X)$ or, wherein $R_{A-C}$ may independently include an alkyl group or hydrogen, $R_D$ may independently include an alkyl group, and X includes Br, I, R, O—R (R=alkyl), fluorosulfonate (—O—$SO_2$—F), or triflate (—O—$SO_2$—$CF_3$). Other embodiments may include non-organometallic derivatizing compounds generally represented by $R_A R_B C$=$CHR_C$, wherein $R_{A-C}$ may independently include an alkyl group or hydrogen.

In other embodiments, passivation may be done in a one step approach by treating the layer with $R_A R_B R_C C(R_D X)$ or $R_A R_B R_C Si(R_D X)$, wherein $R_{A-C}$ may independently include an alkyl group or hydrogen, $R_D$ may independently include an alkyl group, and X includes Cl, Br, I, R, O—R (R=alkyl), fluorosulfonate (—O—$SO_2$—F), or triflate (—O—$SO_2$—$CF_3$). Other embodiments may include passivation using silazanes such as $R_A R_B R_C Si$—NH—$SiR_{A'} R_{B'} R_{C'}$, wherein $R_{A-C}$ and $R_{A'-C'}$ may independently include an alkyl group or hydrogen, or, more preferably, HMDS (hexamethyldisilazane). Other passivation methods may include parylene deposition too.

Passivating may also comprise treating the porous silicon with a hydroxy-trialkyl silane. Preferably, the hydroxy-trialkyl silane corresponds to the general formula HO—Si—$R_1R_2R_3$ wherein $R_{1-3}$ are selected from the group consisting essentially of methyl, ethyl, propyl, iso-propyl, butyl, iso-butyl, and combinations thereof In other embodiments of the invention, the passivation 430 may comprise sealing pores 197 that intersect the surface 194 of the porous silicon 183A. Embodiments may include reacting the porous silicon 183A with a polydentate pore-sealing ligand. The polydentate ligand is preferably a bidentate ligand.

Bidentate and polydendate pore-sealing ligands are advantageous because the ligands have multiple attachment points to the low-k dielectric layer. Many conventional dielectric treatments include molecules having only a single point of attachment. For these molecules, there is a greater chance of their removal during high temperature processing steps or other steps such as sputtering and cleanup. Therefore, embodiments of this invention include using polydentate, pore-sealing molecules having multiple points of attachment.

The pore-sealing ligand may be a reagent manufactured in a separate system and added to the plasma reaction chamber. Or, the pore sealing process may take place in a separate reaction chamber. In other embodiments, the pore-sealing ligand may be generated in situ where it is formed and shortly thereafter reacts with the damaged dielectric surface. The pore-sealing ligand repair process may occur in a single chemical reaction, or in a multi-step reaction.

Small molecules are better able to penetrate the pores and seal the pores inside the bulk due to their lower steric hindrance. In contrast, large molecules react at the entrance of the surface pores, which seals the surface, but hinders internal pore repair. Accordingly, a preferred embodiment comprises a two-step process wherein internal pores are first treated with small repair molecules and subsequently thereafter; external pores are treated large molecules. This last treatment may include a plasma step to free binding positions and a sealing step.

In preferred embodiments, the pore sealing ligand is represented by the general formula X—$CH_2$—$(CH_2)_n$—$CH_2$—X, wherein X is a leaving group and n=0–2. Leaving groups may include H, $NH_2$, Cl, Br, I, $OCH_3$, —$SO_2F$ or triflate (—O—$SO_2$—$CF_3$). Upon formation of Si—O—Si or Si—O—C, HX is typically formed through alternative embodiments include larger ligands that are represented generally by the formula X—$Si(CH_3)_2$—$(CH_2)_n$—$Si(CH_3)_2$—X (n=0–2), wherein X is again the leaving group.

Alternative embodiments may include single or multiply branched (bulky) polydentate ligands. An example of single branched ligands includes compounds represented generally by X—$CH_2$—$(CH_2)_m(CR_1R_2)(CH_2)_o$—$CH_2$—X (2+m+o+1=n/2), wherein $R_1$ and $R_2$ independently H, Alkyl, or Aryl. The polydentate ligand may also comprise a tridentate ligand. A preferred tridentate ligand is represented by the following general formula: X—$CH_2$—$(CH_2)_m(CXH)(CH_2)_o$—$CH_2$—X; or X—$Si(CH_3)_2$—$(CH_2)_m(CXH)(CH_2)_o$—$Si(CH_3)_2$—X; or X—$Si(CH_3)_2$—$(CH_2)_m(SiXCH_3)(CH_2)_o$—$Si(CH_3)_2$—X, where X is the leaving group. The chain length m≈o≈n can be approximated by pore size=(n+2)×1.22 Å.

While exemplary embodiments of the invention have been described for passivation of porous silicon, embodiments herein encompass porous silica as well.

In other embodiments of the invention (not shown), the second dielectric cap 225 may optionally be replaced at this stage by another capping layer that covers dielectric 183 and the conductor 212. Or, rather than replacing the second dielectric cap 225, another capping layer may cover the second dielectric cap 225 and the dielectric 183. Embodiments may also include a repair or modification of the second dielectric cap 225 as well. For example, a modification may include forming an opening in the capping layer to create a via to a subsequently formed next level. The remainder of the device fabrication, including the repeated forming of low-k insulator layers, via and trench etch, and metal deposition for additional metal levels, may then be carried out. The fabrication may also include other dielectrics unrelated to damascene applications wherein the dielectrics are treated according to embodiments of the invention.

Although the present invention and its advantages have been described in detail, it should be understood that various changes, substitutions and alterations may be made herein without departing from the spirit and scope of the invention as defined by the appended claims. It will also be readily understood by those skilled in the art that materials and methods may be varied while remaining within the scope of the present invention.

It is also appreciated that the present invention provides many applicable inventive concepts other than the specific contexts used to illustrate preferred embodiments. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   forming a layer of silicon over a substrate;
   forming an opening through the layer of silicon;
   filling the opening with a conductor;
   anodically etching the layer of silicon so as to form porous silicon; and
   passivating the porous silicon, wherein the passivating comprises treating the porous silicon with a hydroxy-trialkyl silane.

2. The method of claim 1, wherein the hydroxy-trialkyl silane corresponds to the general formula HO—Si—$R_1R_2R_3$ wherein $R_{1-3}$ are selected from the group consisting essentially of methyl, ethyl, propyl, iso-propyl, butyl, iso-butyl, and combinations thereof.

3. A method of manufacturing a semiconductor device, the method comprising:
   forming a layer of silicon over a substrate;
   forming an opening through the layer of silicon;
   filling the opening with a conductor;
   anodically etching the layer of silicon so as to form porous silicon; and
   passivating the porous silicon, wherein the passivating comprises treating the porous silicon with a halogenating agent followed by an organometallic compound.

4. The method of claim 3, wherein the halogenating agent comprises a reagent selected from the group consisting essentially of thionyl chloride, sulfuryl chloride, and carboxydichloride.

5. The method of claim 3, wherein the organometallic compound comprises a reagent selected from the group consisting essentially of a Grignard reagent, lithium dialkylcopper, trimethyl aluminum, and methyl lithium.

6. A method of manufacturing a semiconductor device, the method comprising:
   forming a layer of silicon over a substrate;
   forming an opening through the layer of silicon;
   filling the opening with a conductor; and
   anodically etching the layer of silicon so as to form porous silicon, wherein anodically etching the layer of silicon comprises:
      placing the layer of silicon in contact with an acid electrolyte containing hydrofluoric acid and at least one other acid,
      applying an anodic current for carrying out anodic oxidation of the layer of silicon,
      measuring a potential difference between a pair of electrodes arranged in the acid electrolyte, and
   stopping the anodic oxidation when an increase in the potential difference is detected.

7. A method of manufacturing a semiconductor device, the method comprising:
   forming a layer of silicon over a substrate;
   forming an opening through the layer of silicon;
   filling the opening with a conductor;
   anodically etching the layer of silicon so as to form porous silicon;
   converting the porous silicon to porous silica; and
   passivating the porous silica, comprising at least one of treating the porous silica with a hydroxy-trialkyl silane or treating the porous silica with a halogenating agent followed by an organometallic compound.

8. A method of fabricating a semiconductor device, the method comprising:
   forming a layer comprising functional devices;
   forming an interconnect structure over the layer, wherein the interconnect structure comprises an oxygen free porous silicon; and
   passivating a surface of the interconnect structure.

9. A damascene interconnect structure comprising:
   a conductive feature over a substrate;
   a porous silicon layer over the conductive feature, wherein the porous silicon layer is oxygen free and wherein a surface of the porous silicon layer is passivated;
   a via extending through the porous silicon layer to the conductive feature; and
   a conductor filling the via.

10. The damascene interconnect structure of claim 9, wherein the conductive feature comprises a layer of functional semiconductor devices.

11. The damascene interconnect structure of claim 9, wherein the porous silicon layer has a dielectric constant less than about 3.9.

12. A method of fabricating a semiconductor device, the method comprising:
   forming a layer comprising functional devices; and
   forming an interconnect structure over the layer, wherein the interconnect structure comprises a porous dielectric selected from the group consisting essentially of porous silicon, porous silica, and combinations thereof, wherein the porous dielectric comprises a passivated surface and wherein the passivated surface comprises a chemical compound corresponding to the general formula $R_A R_B R_C C(R_D X)$:
   wherein $R_A$, $R_B$, $R_C$, and $R_D$ are independently hydrogen or an alkyl group; and
   X is a functional group selected from the group consisting of Br, I, O-alkyl, O-fluorosulfonate, and O-triflate.

13. A method of fabricating a semiconductor device, the method comprising:
   forming a layer comprising functional devices; and
   forming an interconnect structure over the layer, wherein the interconnect structure comprises a porous dielectric selected from the group consisting essentially of porous silicon, porous silica, and combinations thereof, wherein the porous dielectric comprises a passivated surface and wherein the passivated surface comprises a chemical compound corresponding to the general formula $R_A R_B C = CHR_C$:
   wherein $R_A$, $R_B$, $R_C$, and $R_D$ are independently hydrogen or an alkyl group; and
   X is a functional group selected from the group consisting of Br, I, O-alkyl, O-fluorosulfonate, and O-triflate.

14. A method of fabricating a semiconductor device, the method comprising:
   forming a layer comprising functional devices; and
   forming an interconnect structure over the layer, wherein the interconnect structure comprises a porous dielectric selected from the group consisting essentially of porous silicon, porous silica, and combinations thereof, wherein the porous dielectric comprises a passivated surface and wherein the passivated surface comprises a chemical compound corresponding to the general formula $R_A R_B R_C CX$:
   wherein $R_A$, $R_B$, $R_C$, and $R_D$ are independently hydrogen or an alkyl group; and
   X is a functional group selected from the group consisting of Br, I, O-alkyl, O-fluorosulfonate, and O-triflate.

15. A method of fabricating a semiconductor device, the method comprising:
   forming a layer comprising functional devices; and
   forming an interconnect structure over the layer, wherein the interconnect structure comprises a porous dielectric selected from the group consisting essentially of porous silicon, porous silica, and combinations thereof, wherein the porous dielectric comprises a passivated surface and wherein the passivated surface comprises a bulky functional group, wherein the bulky functional group is selected from the group consisting essentially of a long chain hydrocarbon, a multi-ring organic group, a macromolecule, and a carbon cage molecule, and combinations thereof.

16. A method of fabricating a semiconductor device, the method comprising:
   forming a layer comprising functional devices; and
   forming an interconnect structure over the layer, wherein the interconnect structure comprises a porous silicon and a passivated surface and wherein the passivated surface comprises a chemical compound corresponding to the general formula $R_A R_B R_C C(R_D X)$:
   wherein $R_A$, $R_B$, $R_C$, and $R_D$ are independently hydrogen or an alkyl group; and
   X is a functional group selected from the group consisting of Br, I, O-alkyl, O-fluorosulfonate, and O-triflate.

17. A method of fabricating a semiconductor device, the method comprising:
   forming a layer comprising functional devices; and
   forming an interconnect structure over the layer, wherein the interconnect structure comprises a porous silicon and a passivated surface and wherein the passivated surface comprises a chemical compound corresponding to the general formula $R_A R_B C = CHR_C$:

wherein $R_A$, $R_B$, $R_C$, and $R_D$ are independently hydrogen or an alkyl group; and X is a functional group selected from the group consisting of Br, I, O-alkyl, O-fluorosulfonate, and O-triflate.

18. A method of fabricating a semiconductor device, the method comprising:

forming a layer comprising functional devices; and forming an interconnect structure over the layer, wherein the interconnect structure comprises a porous silicon and a passivated surface and wherein the passivated surface comprises a chemical compound corresponding to the general formula $R_A R_B R_C CX$:

wherein $R_A$, $R_B$, $R_C$, and $R_D$ are independently hydrogen or an alkyl group; and X is a functional group selected from the group consisting of Br, I, O-alkyl, O-fluorosulfonate, and O-triflate.

19. A method of fabricating a semiconductor device, the method comprising:

forming a layer comprising functional devices; and forming an interconnect structure over the layer, wherein the interconnect structure comprises a porous silicon and a passivated surface and wherein the passivated surface comprises a bulky functional group, wherein the bulky functional group is selected from the group consisting essentially of a long chain hydrocarbon, a multi-ring organic group, a macromolecule, and a carbon cage molecule, and combinations thereof.

20. A damascene interconnect structure comprising:

a conductive feature over a substrate;

a porous silicon layer over the conductive feature, wherein the porous silicon layer comprises a passivated silicon surface corresponding to the general formula $R_A R_B R_C C(R_D X)$:

wherein $R_A$, $R_B$, $R_C$, and $R_D$ are independently hydrogen or an alkyl group; and X is a functional group selected from the group consisting of Br, I, O-alkyl, O-fluorosulfonate, and O-triflate;

a via extending through the porous silicon layer to the conductive feature; and a conductor filling the via.

* * * * *